(12) United States Patent
Smith et al.

(10) Patent No.: US 9,721,793 B2
(45) Date of Patent: Aug. 1, 2017

(54) METHOD OF PATTERNING WITHOUT DUMMY GATES

(71) Applicant: Tokyo Electron Limited, Minato-ku, Tokyo (JP)

(72) Inventors: Jeffrey Smith, Clifton Park, NY (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/222,278

(22) Filed: Jul. 28, 2016

(65) Prior Publication Data

US 2017/0040162 A1   Feb. 9, 2017

Related U.S. Application Data

(60) Provisional application No. 62/202,599, filed on Aug. 7, 2015.

(51) Int. Cl.
*H01L 21/027* (2006.01)
*H01L 21/3213* (2006.01)
*H01L 21/28* (2006.01)
*H01L 21/02* (2006.01)

(52) U.S. Cl.
CPC .... *H01L 21/0274* (2013.01); *H01L 21/02603* (2013.01); *H01L 21/28008* (2013.01); *H01L 21/32133* (2013.01); *H01L 21/32139* (2013.01)

(58) Field of Classification Search
CPC ..... H01L 21/823431; H01L 21/823437; H01L 21/823468; H01L 21/823481; H01L 21/02603; H01L 2221/1094; H01L 29/0669; H01L 21/28008; H01L 21/0274; H01L 21/32133; H01L 21/32139; H01L 27/10826; H01L 27/10879; H01L 29/41791; H01L 29/66795; H01L 2029/7858; H01L 21/823821; H01L 21/845; H01L 27/1211; H01L 27/0886; H01L 27/0924; H01L 29/785
See application file for complete search history.

(56) References Cited

U.S. PATENT DOCUMENTS

| | | | |
|---|---|---|---|
| 9,490,129 B2* | 11/2016 | Hu | H01L 21/308 |
| 2007/0018239 A1* | 1/2007 | Chen | H01L 21/823412 257/329 |
| 2016/0225764 A1* | 8/2016 | Chang | H01L 27/0886 |
| 2016/0300948 A1* | 10/2016 | Yang | H01L 21/823821 |

* cited by examiner

*Primary Examiner* — Yasser A Abdelaziez

(57) ABSTRACT

Techniques herein provide precise cuts for fins and nanowires without needing dummy gate pairs to compensate for overlay misalignment. Techniques herein include using an etch mask to remove designated portions of gate structures to define a trench or open space having fin structures, nanowires, etc. The uncovered fin structures are etched away or otherwise removed from the trench segments. The etch mask and material defining the trench provide a combined etch mask for removing uncovered fin portions. Subsequently the trench segments are filled with dielectric material. Without needed dummy gate pairs a given substrate can fit significantly more electrical devices per unit area.

14 Claims, 8 Drawing Sheets

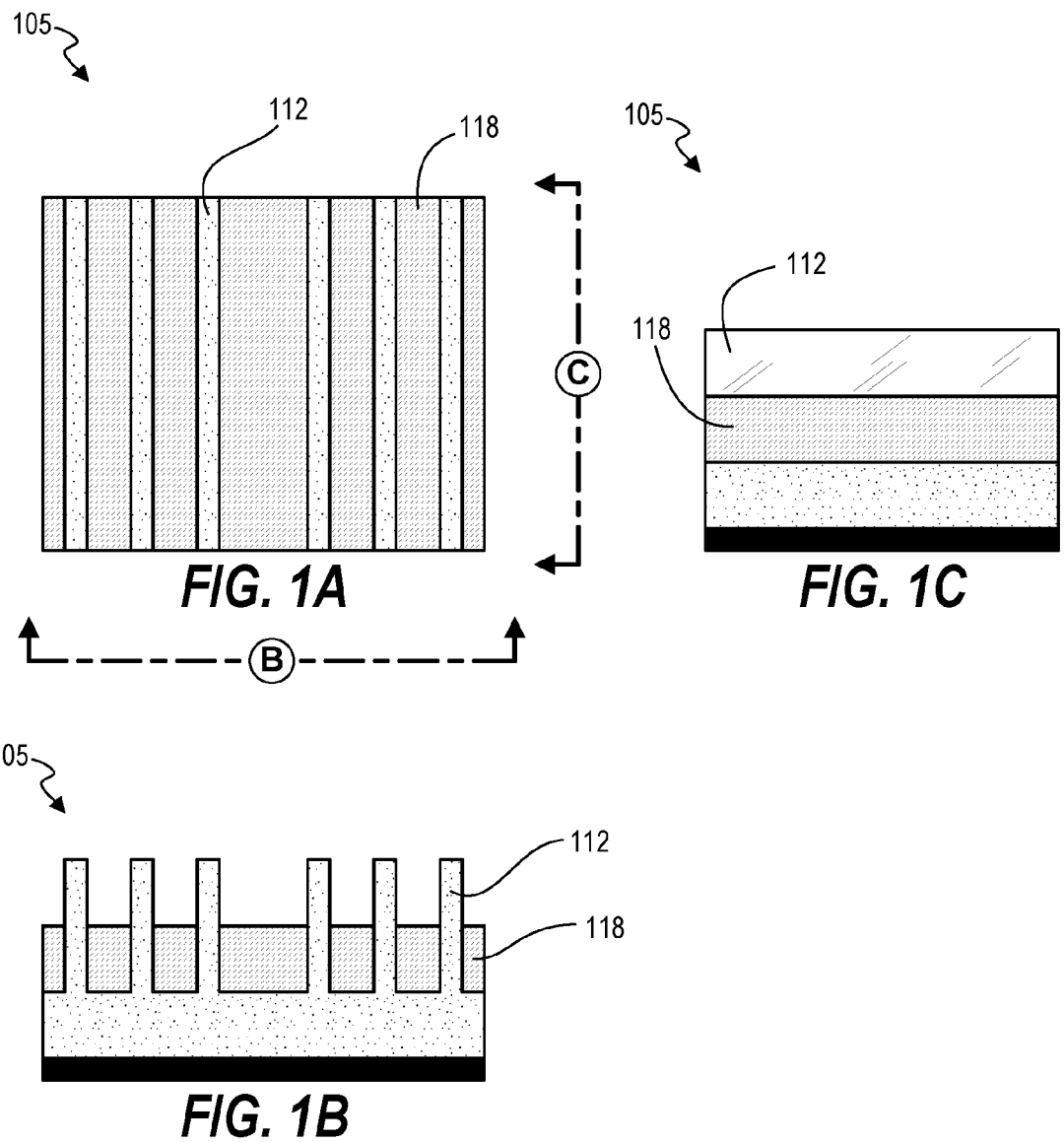

METHOD OF PATTERNING WITHOUT DUMMY GATES

CROSS REFERENCE TO RELATED APPLICATIONS

The present application claims the benefit of U.S. Provisional Patent Application No. 62/202,599, filed on Aug. 7, 2015, entitled "Method of Patterning with Single Diffusion Cuts," which is incorporated herein by reference in its entirety.

BACKGROUND OF THE INVENTION

The present disclosure relates to fabricating semiconductor devices. More particularly, the present disclosure relates to forming and cutting structures such as fins and nanowires.

Transistors, such as field effect transistors (FETs), are the basic elements of microelectronics and integrated circuits. There has been a continuous drive to scale down or shrink transistors and other semiconductor devices to increase density and improve processing performance. Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods and other patterning techniques to overcome optical limitations to make increasingly smaller features.

SUMMARY

In conventional fabrication techniques, such as for cell layouts of logic cells, fins or wires are initially created at relatively long lengths to be subsequently cut at specific locations. Such features can be created using double patterning techniques that shrink feature sizes below a resolution of photolithography systems. Cutting such relatively small features can be problematic because etch masks created by photolithographic systems do not have sufficient resolution to accurately cut or remove material within specified tolerances. Using such conventional etch masks can result in device poor device performance or device failure.

To conventionally cut such fins or wires, two dummy gates are added to a given cell layout. These dummy gates function merely as an etch mask to cut a given gate in combination with a patterned etch mask formed over the gate structures. Thus, a fin is formed and then two dummy gates are used to cut fins because at conventional small patterning scales there are overlay or placement issues with forming a patterned mask above the fins for making cuts. Accordingly, conventional techniques use two dummy gates are used to ensure that fin cuts happen at desired locations, which is typically between the dummy gates. An etch mask is formed with openings uncovering a region between the two dummy gates, with the dummy gates used ensure cuts happen at specific locations with this combined mask. In other words, a relatively large opening in an etch masked is created (with some misalignment) while dummy gates further narrow the etch mask.

Thus, because of placement, overlay, and CD issues, conventional techniques teach having a dummy gate on each side of the cut. Using dummy gate pairs, however, has disadvantages. One issue with using dummy gate pairs to cut fins is that dummy gates take up a lot of real estate and do not contribute to the function of a given cell. Such dummy gates merely function as a corrective measure to address variability in mask placement. Cells become larger than desired because of all of the space needed to accommodate dummy gate pairs. Moreover, such dummy gates, in subsequent steps, become metalized but remain on a given circuit as a dummy gate with no electrical contact being made to the dummy gates.

Techniques herein provide precise cuts for fins and nanowires without needing dummy gate pairs to ensure accuracy. Techniques herein include leaving fins uncut until gates are opened, and then one opened gate structure is used to focus placement of cuts. Surrounding dielectric material is used as part of an etch mask to ensure cuts happen at specified locations. With etch selectivity to gate spacer material, uncovered fins—further defined by an etch mask formed thereon—can be etched inside/within a space formerly occupied by a gate structure. After etching the uncovered fins, the space can be filled with dielectric material. Such filler dielectric material can remain in place which results in the space formerly occupied by the gate structure does not become metallized but remains as a dielectric. This means that there are no metallized dummy gates left on the device, and that pairs of dummy gates are not needed to be designed into the cell. Accordingly, with techniques herein, using two dummy gates just as a compensating etch mask is no longer needed, which means more real estate in a given cell can be used for functional devices, thereby increasing device density.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 1A is a top view of an example substrate segment showing a process flow according to embodiments disclosed herein.

FIG. 1B is a front cross-sectional view of an example substrate segment showing a process flow according to embodiments disclosed herein.

FIG. 1C is a side cross-sectional view of an example substrate segment showing a process flow according to embodiments disclosed herein.

DETAILED DESCRIPTION

Techniques herein provide precise cuts for fins and nanowires without needing dummy gate pairs to ensure accuracy. Techniques herein include leaving fins uncut until gates are opened, and then one opened gate structure is used to focus placement of cuts. Surrounding dielectric material is used as part of an etch mask to ensure cuts happen at specified locations. With etch selectivity to gate spacer material, uncovered fins—further defined by an etch mask formed thereon—can be etched inside/within a space formerly occupied by a gate structure. After etching the uncovered fins, the space can be filled with dielectric material. Such filler dielectric material can remain in place which results in the space formerly occupied by the gate structure does not become metallized but remains as a dielectric. This means that there are no metallized dummy gates left on the device, and that pairs of dummy gates are not needed to be designed into the cell. Accordingly, with techniques herein, using two dummy gates just as a compensating etch mask is no longer needed, which means more real estate in a given cell can be used for functional devices, thereby increasing device density.

FIGS. 1-8 illustrate process flow of example embodiments herein. Note that FIGS. with reference letter "A" are top views of an example substrate segment. FIGS. with a reference letter "B" show corresponding front views, while FIGS. with a reference letter "C" show corresponding side views. FIG. 1A includes cross sectional lines B and C to identify corresponding views.

One embodiment includes a method for patterning a substrate. Such a substrate can be a semiconductor wafer being patterned such as for forming transistor devices or other electronic devices thereon. Referring now to FIG. 1, an array of fin structures 112 is formed on a working surface of a substrate 105. Note that material of such fin structures can extend downward into (or up from) dielectric layer 118. Dielectric layer 118 thus can be formed on sides of fin structures 112. In some embodiments, dielectric layer 118 can be a shallow trench isolation layer or material. The fin structures can include a set of linear structures extending above an underlying layer with the fin structures being parallel with each other.

Figure 2A:
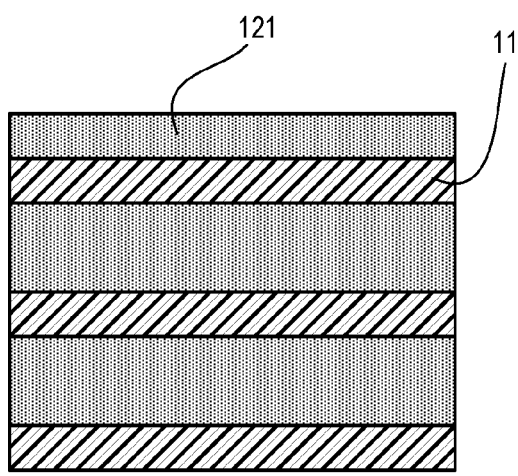
FIG. 2A is a top view of an example substrate segment showing a process flow according to embodiments disclosed herein.
Figure 2C:
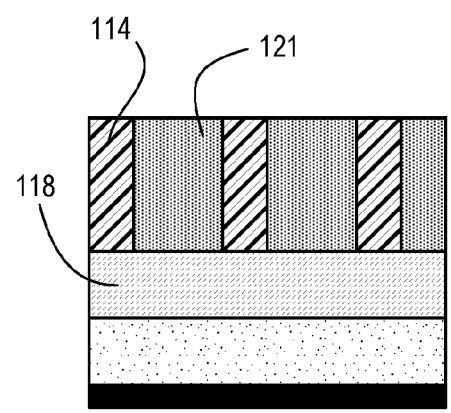
FIG. 2C is a side cross-sectional view of an example substrate segment showing a process flow according to embodiments disclosed herein.
Figure 2B:
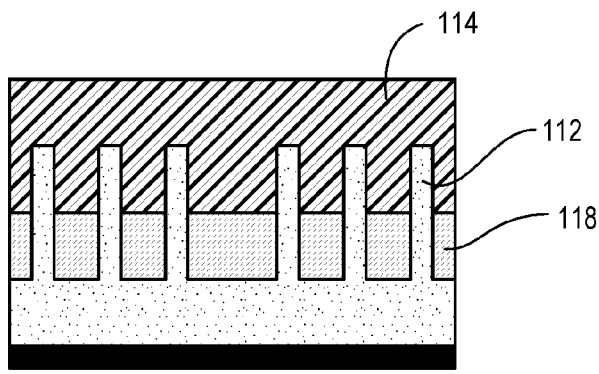
FIG. 2B is a front cross-sectional view of an example substrate segment showing a process flow according to embodiments disclosed herein.

Referring now to FIG. 2, an array of gate structures 114 is formed on the working surface of the substrate. The array of gate structures 114 have gate structures 114 crossing and covering a portion of fin structures 112 of the array of fin structures 112. The array of gate structures 114 includes first dielectric material 121 abutting sidewalls of the gate structures 114 and covering a remaining portion of the fin structures 112. In other words, first dielectric material 121 can fill areas between gate structures 114. Note that gate structures 114 are not necessarily final or functional gate material, but may subsequently be replaced with metal or other conductor. Gate structures 114 can have a greater height as compared to the fin structures and can be formed on sidewalls of fin structures. Gate structures can include a set of linear structures extending above an underlying layer, and that perpendicularly cross the fin structures.

Figure 3A:
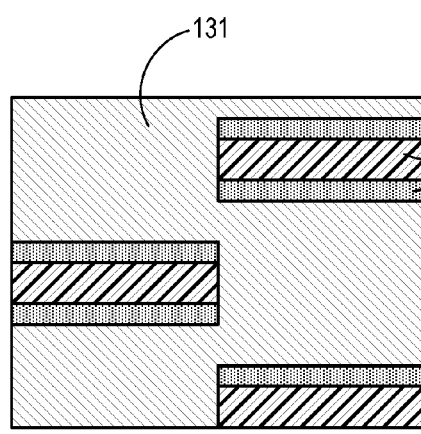
FIG. 3A is a top view of an example substrate segment showing a process flow according to embodiments disclosed herein.
Figure 3C:
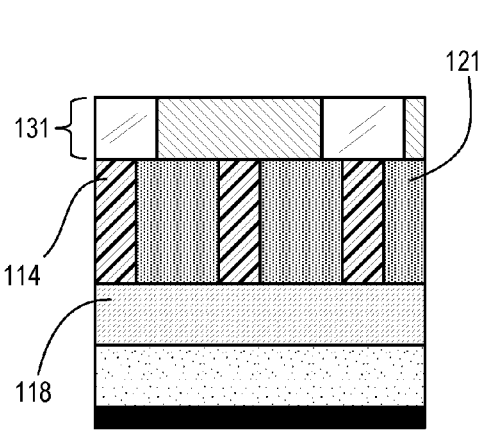
FIG. 3C is a side cross-sectional view of an example substrate segment showing a process flow according to embodiments disclosed herein.
Figure 3B:
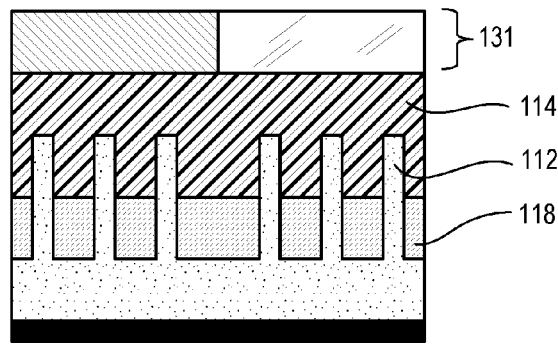
FIG. 3B is a front cross-sectional view of an example substrate segment showing a process flow according to embodiments disclosed herein.

Referring now to FIG. 3, a first etch mask 131 is formed on the substrate that uncovers portions of the gate structures 114. Such an etch mask can be formed, for example, using photoresist and photolithographic exposure and development. Such an etch mask can include depositing other films (not shown) on the substrate such as planarizing films and anti-reflective coatings. First etch mask 131 is depicted as defining openings that uncover/expose sections of both gate structures 114 and first dielectric material 121 because such etch masks typically do not have resolution sufficient to isolate just a width of a given gate spacer structure.

Figure 4A:
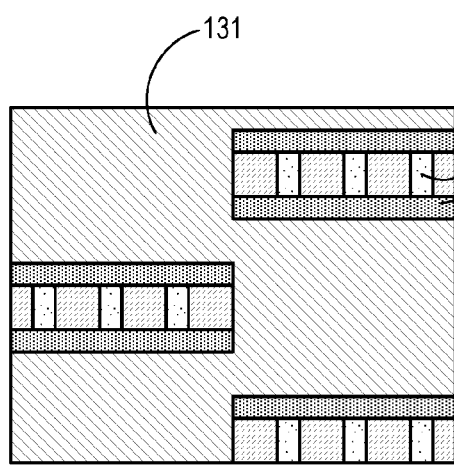
FIG. 4A is a top view of an example substrate segment showing a process flow according to embodiments disclosed herein.
Figure 4C:
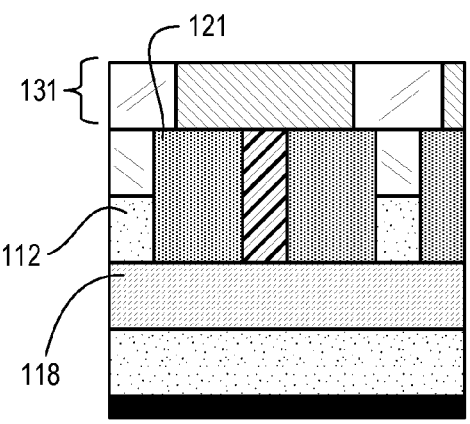
FIG. 4C is a side cross-sectional view of an example substrate segment showing a process flow according to embodiments disclosed herein.
Figure 4B:
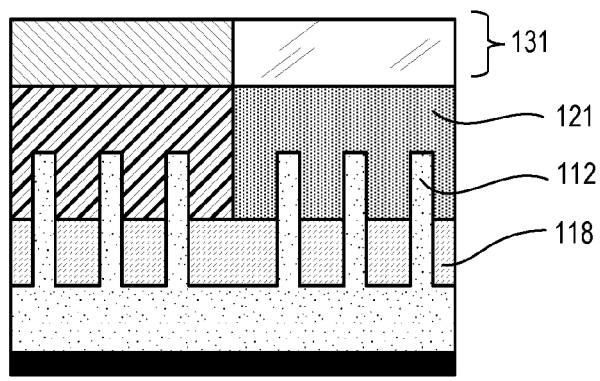
FIG. 4B is a front cross-sectional view of an example substrate segment showing a process flow according to embodiments disclosed herein.
Figure 5A:
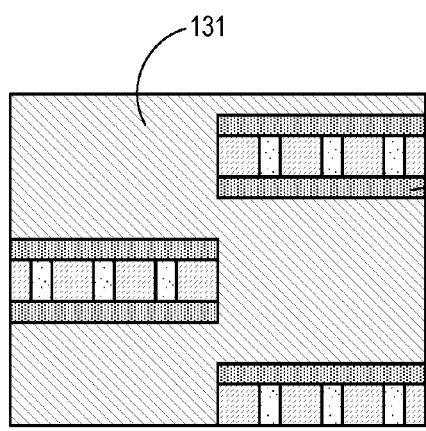
FIG. 5A is a top view of an example substrate segment showing a process flow according to embodiments disclosed herein.
Figure 5C:
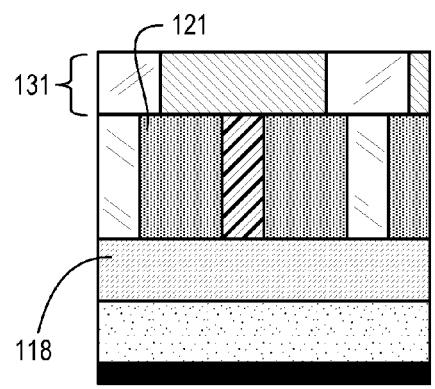
FIG. 5C is a side cross-sectional view of an example substrate segment showing a process flow according to embodiments disclosed herein.
Figure 5B:
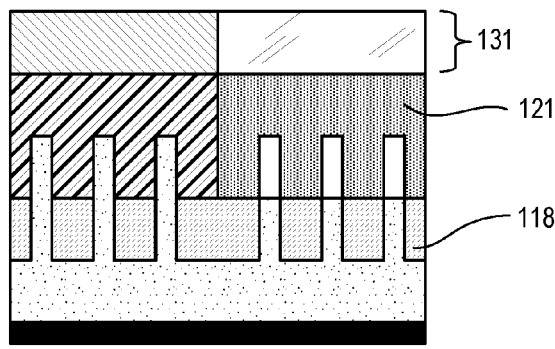
FIG. 5B is a front cross-sectional view of an example substrate segment showing a process flow according to embodiments disclosed herein.
Figure 6A:
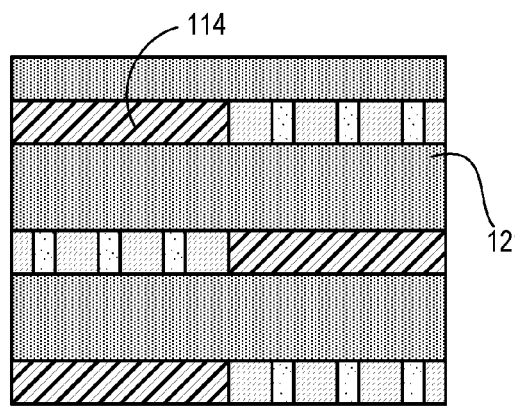
FIG. 6A is a top view of an example substrate segment showing a process flow according to embodiments disclosed herein.
Figure 6C:
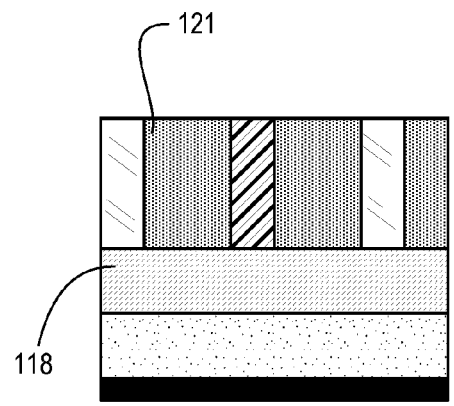
FIG. 6C is a side cross-sectional view of an example substrate segment showing a process flow according to embodiments disclosed herein.
Figure 6B:
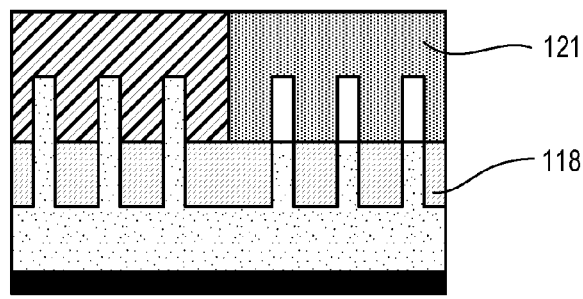
FIG. 6B is a front cross-sectional view of an example substrate segment showing a process flow according to embodiments disclosed herein.

Referring now to FIG. 4, portions of the gate structures 114 that are uncovered by the first etch mask 131 are removed resulting in forming trench segments defined by the first dielectric material 121, with portions of the fin structures 112 being uncovered within the trench segments. Removing portions of the gate structures 114 can include executing a first etch process that etches portions of the gate structures that are uncovered relative to the first etch mask. For example a plasma-based anisotropic etch can be executed that etches material of the gate structures while the first dielectric material 121 and the first etch mask 131 resist being etched by selected etchants Referring now to FIG. 5, uncovered fin structures are removed from the trench segments. Note that some embodiments can have fin material extending below into a shallow trench isolation layer or other underlying layer. The fin structures, however, are nevertheless removed from the trench segments, that is, the uncovered fin structures are removed from the space that previously contained a portion of a gate structure. Removing the uncovered fin structures includes executing a second etch process that etches material of the fin structures with respect to material of the gate structures. In some embodiments, the fin structures can include a protective film, such as an oxide film. In such embodiments, this protective film can be removed prior to removing the uncovered fin structures themselves. Any such films can optionally be removed via atomic layer etching for increased selectivity. Executing the second etch process can alternatively include executing an isotropic etch that laterally recesses the uncovered fin structures past sidewalls of trench segments. Such an isotropic etch can be executed after a directional etch that removes the fin structures from the trench segments, and then fin structures can be laterally etched past sidewalls of first dielectric material 121. The first etch mask 131 can be removed, as shown in FIG. 6.

Figure 7A:
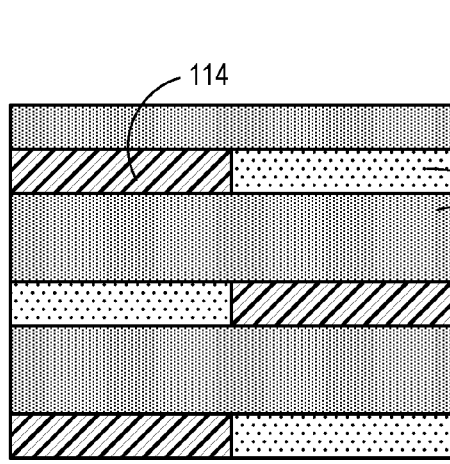
FIG. 7A is a top view of an example substrate segment showing a process flow according to embodiments disclosed herein.
Figure 7C:
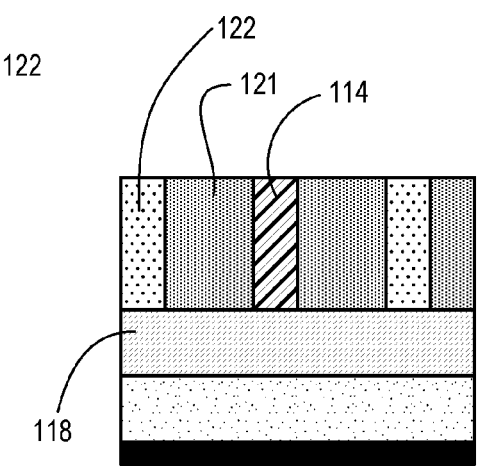
FIG. 7C is a side cross-sectional view of an example substrate segment showing a process flow according to embodiments disclosed herein.
Figure 7B:
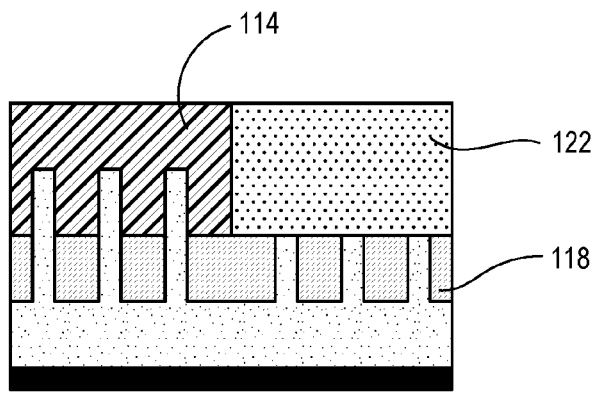
FIG. 7B is a front cross-sectional view of an example substrate segment showing a process flow according to embodiments disclosed herein.

Referring now to FIG. 7, the trench segments are filled with a second dielectric material 122. Filling the trench segments with the second dielectric material 122 can include depositing an overburden of dielectric material and planarizing the substrate down to top surfaces of the gate structures 114, such as by an etch back process or chemical-mechanical planarization (CMP). For CMP planarization, it can be beneficial to fill the trenches with silicon nitride.

Figure 8A:
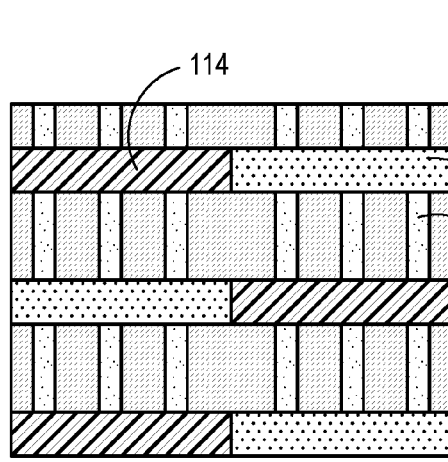
FIG. 8A is a top view of an example substrate segment showing a process flow according to embodiments disclosed herein.
Figure 8C:
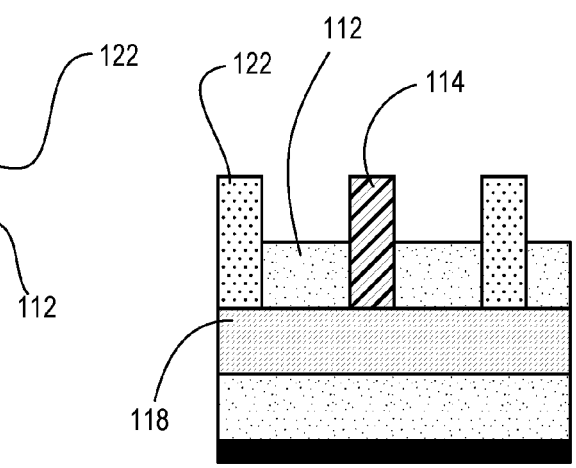
FIG. 8C is a side cross-sectional view of an example substrate segment showing a process flow according to embodiments disclosed herein.
Figure 8B:
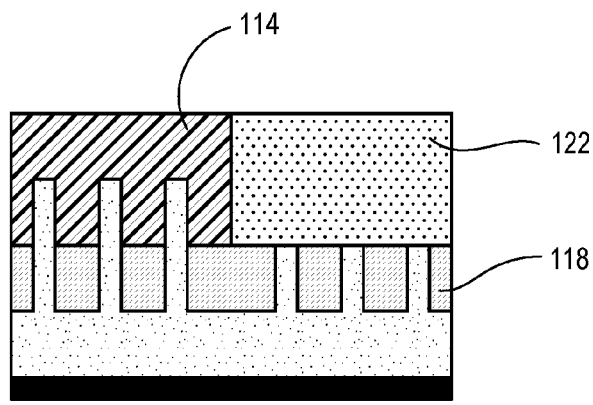
FIG. 8B is a front cross-sectional view of an example substrate segment showing a process flow according to embodiments disclosed herein.

Other fabrication steps can then be continued. FIG. 8 shows first dielectric material 121 having been removed. Note that fins pass through gate structures 114, but do not extend through second dielectric material 122. This results in fins being cut at selected locations defined by gate structure portions, and then the space when gate structures and fin structures have been removed is filled with a dielectric material, which electrically insulates the fins at desired locations without needing extra substrate space to design dummy gates just for cutting fins. Accordingly, more transistors or other devices per unit area can be realized with techniques herein.

Techniques herein can apply to any micro-fabricated structures that are first formed as a relatively larger or longer structure to be cut or cut down subsequently. The previous embodiment focused on cutting fin structures. Other embodiments are readily apparent to those of skill in the art. For example, cutting nanowires is executed similarly to that of cutting fins. Removing selected gate structure portions to reveal open spaces with nanowire segments enables nanowires to be cut (removed via etching), and then subsequently filled with dielectric material. Accordingly, techniques herein can be embodied with both 2-Dimensional and 3-Dimensional circuit designs. In other embodiments, instead of cutting/removing uncovered fin structures within a given defined trench or open space, the uncovered fin structures can be doped sufficiently to prevent any electrical conduction through those fin segments.

Various different materials can be used. The various materials can be selected to have differing etch resistivities to selectively etch one or more materials without (substantially) etching other materials. Gate structures themselves can be silicon. Fin structures can also be silicon, but with a thin oxide layer. Dielectric materials can be identical or have differing etch resistivities.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
    forming an array of fin structures on a working surface of a substrate;
    forming an array of gate structures on the working surface of the substrate, the array of gate structures having gate structures crossing and covering a portion of fin structures of the array of fin structures, the array of gate structures including first dielectric material abutting sidewalls of the gate structures and covering a remaining portion of the fin structures;

forming a first etch mask on the substrate that uncovers portions of the gate structures;

removing portions of the gate structures that are uncovered by the first etch mask resulting in forming trench segments defined by the first dielectric material with portions of the fin structures being uncovered within the trench segments;

removing uncovered fin structures from the trench segments; and filling the trench segments with a second dielectric material.

2. The method of claim 1, wherein removing portions of the gate structures that are uncovered includes executing a first etch process that etches portions of the gate structures that are uncovered relative to the first etch mask.

3. The method of claim 1, wherein removing the uncovered fin structures includes executing a second etch process that etches material of the fin structures with respect to material of the gate structures.

4. The method of claim 3, wherein the fin structures include a protective film; and further comprising prior to removing the uncovered fin structures, removing the protective film from the uncovered fin structures.

5. The method of claim 3, wherein executing the second etch process includes executing an isotropic etch that laterally recesses the uncovered fin structures past sidewalls of the trench segments.

6. The method of claim 1, wherein filling the trench segments with the second dielectric material includes depositing an overburden of dielectric material and planarizing the substrate down to top surfaces of the gate structures.

7. The method of claim 1, wherein the fin structures include a set of linear structures extending above an underlying layer with the fin structures being parallel with each other.

8. The method of claim 1, wherein the gate structures include a set of linear structures extending above an underlying layer and perpendicularly crossing the fin structures.

9. The method of claim 1, wherein the first etch mask is formed by photolithographic exposure and development of a photoresist film.

10. A method for patterning a substrate, the method comprising:

forming an array of nanowire structures on a working surface of a substrate;

forming an array of gate structures on the working surface of the substrate, the array of gate structures having gate structures crossing and covering a portion of the nanowire structures, the array of gate structures including first dielectric material abutting sidewalls of the gate structures and covering a remaining portion of the nanowire structures;

forming a first etch mask on the substrate that uncovers portions of the gate structures;

removing portions of the gate structures that are uncovered by the first etch mask resulting in forming open spaces defined by the first dielectric material with portions of the nanowire structures being uncovered within the open spaces;

removing uncovered nanowire structures from the open spaces; and filling the open spaces with a second dielectric material.

11. The method of claim 10, wherein removing portions of the gate structures that are uncovered includes executing a first etch process that etches the portions of the gate structures that are uncovered relative to the first etch mask.

12. The method of claim 10, wherein removing the uncovered nanowire structures includes executing a second etch process that etches material of the nanowire structures with respect to material of the gate structures.

13. The method of claim 12, wherein the nanowire structures include a protective film; and further comprising prior to removing the uncovered nanowire structures, removing the protective film from the uncovered nanowire structures.

14. The method of claim 12, wherein executing the second etch process includes executing an isotropic etch that laterally recesses the uncovered nanowire structures past sidewalls of the open spaces.

* * * * *